US012770560B2

(12) United States Patent
Liu et al.

(10) Patent No.: US 12,770,560 B2
(45) Date of Patent: Oct. 20, 2026

(54) DISPLAY MODULE AND DISPLAY DEVICE

(71) Applicant: SITAN SEMICONDUCTOR INTERNATIONAL CO.LIMITED, Hong Kong (CN)

(72) Inventors: Zhaojun Liu, Hong Kong (CN); Ke Zhang, Hong Kong (CN)

(73) Assignee: SITAN SEMICONDUCTOR INTERNATIONAL CO.LIMITED, Hong Kong (CN)

( * ) Notice: Subject to any disclaimer, the term of this patent is extended or adjusted under 35 U.S.C. 154(b) by 170 days.

(21) Appl. No.: 18/846,284

(22) PCT Filed: Jun. 19, 2023

(86) PCT No.: PCT/CN2023/101145
§ 371 (c)(1),
(2) Date: Sep. 12, 2024

(87) PCT Pub. No.: WO2024/259567
PCT Pub. Date: Dec. 26, 2024

(65) Prior Publication Data
US 2026/0179548 A1 Jun. 25, 2026

(51) Int. Cl.
*G09G 3/3291* (2016.01)
*G02B 27/01* (2006.01)
(Continued)

(52) U.S. Cl.
CPC ........ *G09G 3/3233* (2013.01); *H10W 90/724* (2026.01); *H10W 90/734* (2026.01)

(58) Field of Classification Search
CPC ............. G09G 3/32; G09G 2300/0842; G09G 3/3233; G09G 2300/0426; G09G 3/2003; G09G 2300/0819; G09G 2300/0861; G09G 3/2018; G09G 2300/0452; G09G 2310/0235; G09G 2340/06; G09G 3/3225; G09G 2300/0408; G09G 2320/0626; G09G 2330/12; G09G 2300/0465; G09G 2310/0251; G09G 2300/0814;
(Continued)

(56) References Cited

U.S. PATENT DOCUMENTS

2006/0159424 A1* 7/2006 Hu ........................ H04N 5/913 386/233
2013/0057531 A1* 3/2013 Lim ........................ G09G 3/20 345/211
(Continued)

FOREIGN PATENT DOCUMENTS

CN 106654071 A 5/2017
CN 113454778 A 9/2021
(Continued)

*Primary Examiner* — Nan-Ying Yang

(57) ABSTRACT

The present disclosure provides a display module. The display module includes: a substrate, a function chip located on the substrate, a pixel driver chip located on the function chip, and an optical chip located on the pixel driver chip. The function chip is used to realize functions of the display module other than light emission driving and light emission. The pixel driver chip and the function chip are chips that are independent of each other, and the pixel driver chip and the function chip are stacked and packaged through chip stacking technology.

24 Claims, 4 Drawing Sheets

(51) Int. Cl.
*G09G 3/3233* (2016.01)
*G09G 3/3258* (2016.01)
*G09G 3/3266* (2016.01)
*H10W 90/00* (2026.01)

(58) Field of Classification Search
CPC ......... G09G 2310/0297; G09G 3/3208; G09G 2310/08; G09G 2320/0209; G09G 3/2014; G09G 2300/026; G09G 2300/0804; G09G 2300/0852; G09G 2300/0857; G09G 2310/0221; G09G 2310/0286; G09G 2320/043; G09G 2330/10; G09G 3/20; G09G 3/3216; G09G 3/006; G09G 2300/0404; G09G 2310/0262; G09G 2310/0267; G09G 2320/0285; G09G 2320/029; G09G 2320/0295; G09G 2320/045; G09G 2320/046; G09G 2320/064; G09G 2330/028; G09G 2330/08; G09G 2360/145; G09G 3/14; G09G 3/2096; G09G 3/22; G09G 3/3258; G09G 3/3659; G09G 3/3688; G09G 2310/0275; G09G 2320/0214; G09G 2320/0233; G09G 2330/06; G09G 3/2011; G09G 3/3241; G09G 5/10; G09G 2300/0413; G09G 2300/0439; G09G 2300/0443; G09G 2300/0809; G09G 2300/0847; G09G 2310/0243; G09G 2310/0264; G09G 2310/0272; G09G 2310/061; G09G 2320/0219; G09G 2320/0223; G09G 2320/103; G09G 2330/02; G09G 2330/021; G09G 2330/04; G09G 2340/0457; G09G 2360/10; G09G 2370/00; G09G 2380/00; G09G 3/2022; G09G 3/2085; G09G 3/3266; G09G 3/3275; G09G 3/3426; G09G 5/006; G09G 5/008; G09G 2300/043; G09G 2320/0247; G09G 2320/0257; G09G 2320/0673; G09G 2330/023; G09G 3/2081; G09G 3/2092; G09G 3/34; G09G 5/39
See application file for complete search history.

(56) References Cited

U.S. PATENT DOCUMENTS

| | | | | |
|---|---|---|---|---|
| 2019/0180696 | A1* | 6/2019 | Park | G09G 3/3291 |
| 2019/0213860 | A1* | 7/2019 | Shaprio | H04W 4/02 |
| 2023/0179737 | A1* | 6/2023 | Zhu | G09G 5/005<br>348/441 |

FOREIGN PATENT DOCUMENTS

| | | | |
|---|---|---|---|
| CN | 114420803 | A | 4/2022 |
| CN | 115206952 | A | 10/2022 |
| CN | 115241171 | A | 10/2022 |
| KR | 1020210121246 | A | 10/2021 |

* cited by examiner

DISPLAY MODULE AND DISPLAY DEVICE

TECHNICAL FIELD

The embodiments of the present disclosure relate to the field of semiconductor technology and, in particular, relate to a display module and a display device.

BACKGROUND TECHNOLOGY

With the development of augmented reality (abbreviated as AR) technology, virtual reality (abbreviated as VR) technology and micro-projection technology, optical machines that are smaller in size and lighter in weight have become the important considerations for the products.

CONTENTS OF THE INVENTION

The embodiments described herein provide a display module and a display device.

According to a first aspect of the present disclosure, a display module is provided. The display module includes: a substrate, a function chip located on the substrate, a pixel driver chip located on the function chip, and an optical chip located on the pixel driver chip. The function chip is used to realize functions of the display module other than light emission driving and light emission. The pixel driver chip and the function chip are chips that are independent of each other, and the pixel driver chip and the function chip are stacked and packaged through chip stacking technology.

In some embodiments of the present disclosure, the pixel driver chip and the optical chip are homogeneous integrated chips.

In some embodiments of the present disclosure, the pixel driver chip and the optical chip are chips that are independent of each other. The optical chip is bonded on the pixel driver chip.

In some embodiments of the present disclosure, the orthographic projection of the optical chip on the substrate is included in the orthographic projection of the pixel driver chip on the substrate.

In some embodiments of the present disclosure, the orthographic projection of the function chip on the substrate and the orthographic projection of the pixel driver chip on the substrate are completely overlapped.

In some embodiments of the present disclosure, the pixel driver chip includes: a pixel drive circuit array and at least one first lower level bonding region. The function chip includes at least one first upper level bonding region. The orthographic projection of the at least one first lower level bonding region on the substrate and the orthographic projection of the at least one first upper level bonding region on the substrate are at least partially overlapped. The first lower level bonding region and the first upper level bonding region are correspondingly connected so that the pixel driver chip and the function chip are in communication with each other.

In some embodiments of the present disclosure, the orthographic projection of the pixel drive circuit array on the substrate and the orthographic projection of the optical chip on the substrate are completely overlapped. The orthographic projection of the at least one first lower level bonding region on the substrate and the orthographic projection of the optical chip on the substrate are not overlapped.

In some embodiments of the present disclosure, the at least one first upper level bonding region is provided with at least one bonding pad. The first lower level bonding region is bonded to the at least one bonding pad in the first upper level bonding region through a through-silicon via.

In some embodiments of the present disclosure, the first lower level bonding region is connected with the first upper level bonding region through a direct interconnection structure. The direct interconnection structure is the shortest interconnection structure that connects the first lower level bonding region and the first upper level bonding region.

In some embodiments of the present disclosure, the function chip includes a row scanning circuit, a column scanning circuit, and at least one of the following: a timing controller, a video processing and algorithm compensation circuit, a power management circuit, a data channel, a data storage unit, an interface circuit, a register configuration circuit, and a sensor circuit.

In some embodiments of the present disclosure, the function chip includes a first sub-function chip and a second sub-function chip. The first sub-function chip is located on the second sub-function chip. The first sub-function chip and the second sub-function chip are chips that are independent of each other, and the first sub-function chip and the second sub-function chip are stacked and packaged through chip stacking technology. The first sub-function chip includes a row scanning circuit, a column scanning circuit, and at least one of the following: a timing controller, a video processing and algorithm compensation circuit, a first power management circuit, and a data channel. The second sub-function chip includes at least one of the following: a data storage unit, an interface circuit, a second power management circuit, a register configuration circuit, and a sensor circuit.

In some embodiments of the present disclosure, the first sub-function chip further includes: at least one second lower level bonding region. The second sub-function chip further includes: at least one second upper level bonding region. The orthographic projection of the at least one second lower level bonding region on the substrate and the orthographic projection of the at least one second upper level bonding region on the substrate are at least partially overlapped. The second lower level bonding region and the second upper level bonding region are correspondingly connected so that the first sub-function chip and the second sub-function chip are in communication with each other.

In some embodiments of the present disclosure, the first sub-function chip includes a data channel, the data channel being arranged adjacent to the at least one second lower level bonding region.

In some embodiments of the present disclosure, the first sub-function chip further includes: the at least one first upper level bonding region. The row scanning circuit and the column scanning circuit are arranged adjacent to the at least one first upper level bonding region.

In some embodiments of the present disclosure, the first sub-function chip includes a timing controller. The timing controller is arranged adjacent to the row scanning circuit and the column scanning circuit.

In some embodiments of the present disclosure, the first sub-function chip includes a video processing and algorithm compensation circuit and a data channel. The video processing and algorithm compensation circuit is arranged adjacent to the column scanning circuit and the data channel.

In some embodiments of the present disclosure, the substrate includes a first external bonding region. The first external bonding region is used to connect with an external communication connection medium. The second sub-function chip further includes: a second external bonding region and an interface circuit. The orthographic projection of the first external bonding region on the substrate and the orthographic projection of the second external bonding region on the substrate are at least partially overlapped. The interface circuit is arranged adjacent to the second external bonding region.

In some embodiments of the present disclosure, the first sub-function chip includes a first power management circuit. The first power management circuit is configured to provide a first current. The second sub-function chip includes a second power management circuit. The second power management circuit is configured to provide a second current that is greater than the first current.

In some embodiments of the present disclosure, the pixel driver chip further includes: a row scanning circuit and a column scanning circuit. The orthographic projection of the pixel drive circuit array on the substrate and the orthographic projection of the optical chip on the substrate are completely overlapped. The orthographic projections of the at least one first lower level bonding region, the row scanning circuit and the column scanning circuit on the substrate and the orthographic projection of the optical chip on the substrate are not overlapped.

In some embodiments of the present disclosure, at least one bonding pad is provided in the at least one first upper level bonding region. The first lower level bonding region is bonded to the at least one bonding pad in the first upper level bonding region through a through-silicon via.

In some embodiments of the present disclosure, the first lower level bonding region is connected with the first upper level bonding region through a direct interconnection structure. The direct interconnection structure is the shortest interconnection structure that connects the first lower level bonding region and the first upper level bonding region.

In some embodiments of the present disclosure, the function chip includes at least one of the following: a timing controller, a video processing and algorithm compensation circuit, a power management circuit, a data channel, a data storage unit, an interface circuit, a register configuration circuit, and a sensor circuit.

In some embodiments of the present disclosure, the function chip includes a first sub-function chip and a second sub-function chip. The first sub-function chip is located on the second sub-function chip. The first sub-function chip and the second sub-function chip are chips that are independent of each other, and the first sub-function chip and the second sub-function chip are stacked and packaged through chip stacking technology.

The first sub-function chip includes at least one of the following: a timing controller, a video processing and algorithm compensation circuit, a first power management circuit, and a data channel. The second sub-function chip includes at least one of the following: a data storage unit, an interface circuit, a second power management circuit, a register configuration circuit, and a sensor circuit.

In some embodiments of the present disclosure, the first sub-function chip further includes: at least one second lower level bonding region. The second sub-function chip further includes: at least one second upper level bonding region. The orthographic projection of the at least one second lower level bonding region on the substrate and the orthographic projection of the at least one second upper level bonding region on the substrate are at least partially overlapped. The second lower level bonding region and the second upper level bonding region are correspondingly connected so that the first sub-function chip and the second sub-function chip are in communication with each other.

In some embodiments of the present disclosure, the first sub-function chip includes a data channel, the data channel being arranged adjacent to the at least one second lower level bonding region.

In some embodiments of the present disclosure, the first sub-function chip further includes: the at least one first upper level bonding region and a timing controller. The timing controller is arranged adjacent to the at least one first upper level bonding region.

In some embodiments of the present disclosure, the first sub-function chip includes a video processing and algorithm compensation circuit and a data channel, the video processing and algorithm compensation circuit being arranged adjacent to the data channel.

In some embodiments of the present disclosure, the substrate includes a first external bonding region. The first external bonding region is used to connect with an external communication connection medium. The second sub-function chip further includes: a second external bonding region and an interface circuit. The orthographic projection of the first external bonding region on the substrate and the orthographic projection of the second external bonding region on the substrate are at least partially overlapped. The interface circuit is arranged adjacent to the second external bonding region.

In some embodiments of the present disclosure, the first sub-function chip includes a first power management circuit. The first power management circuit is configured to provide a first current. The second sub-function chip includes a second power management circuit. The second power management circuit is configured to provide a second current that is greater than the first current.

In some embodiments of the present disclosure, the display module is a micro-display module.

According to a second aspect of the present disclosure, a display device is provided. The display device includes the display module described according to the first aspect of the present disclosure.

DESCRIPTION OF THE DRAWINGS

In order to more clearly illustrate the technical solutions of the embodiments of the present disclosure, the drawings of the embodiments will be briefly described below. It should be understood that the below description of the drawings only relates to some embodiments of the present disclosure and does not limit the present disclosure, wherein.

Figure 1:
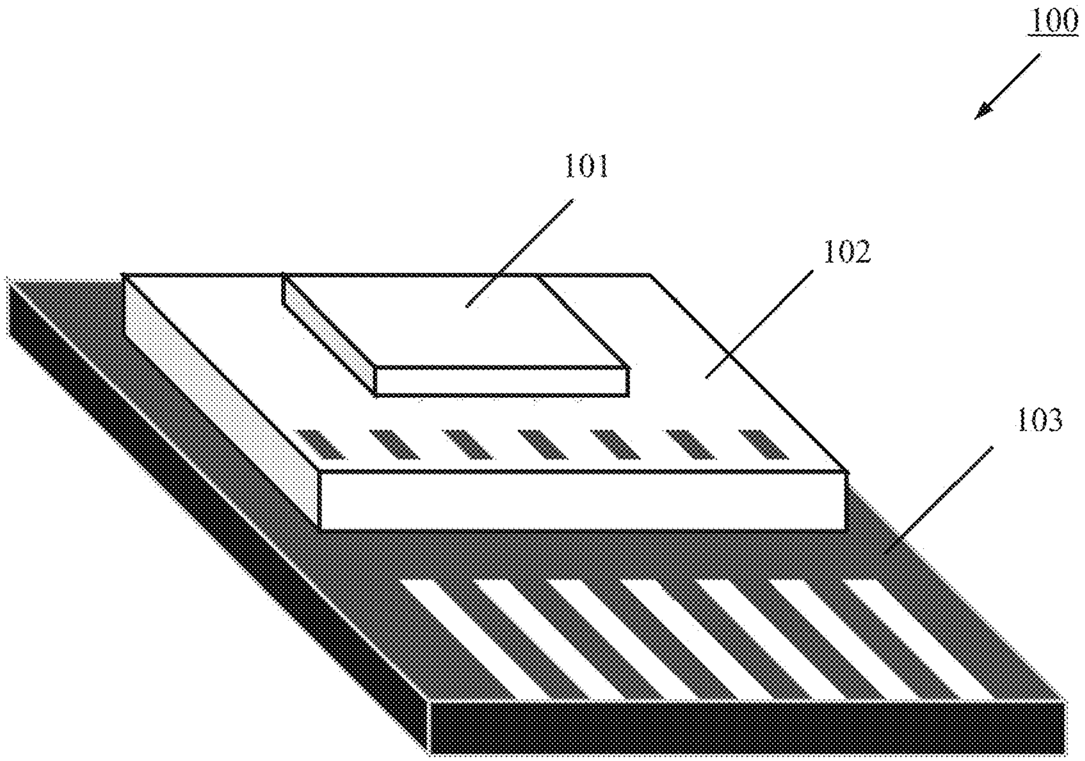
FIG. 1 is a structural schematic diagram of a display module.

It should be noted that the elements in the figures are schematic and are not drawn to scale.

DETAILED EMBODIMENTS

In order to make the objectives, technical solutions, and advantages of the embodiments of the present disclosure clearer, the technical solutions of the embodiments of the present disclosure will be clearly and completely described below in conjunction with the accompanying drawings. Obviously, the described embodiments are some, but not all, of the embodiments of the present disclosure. Based on the described embodiments of the present disclosure, all other embodiments obtained by those skilled in the art without creative efforts also fall within the scope of protection of the present disclosure.

Unless otherwise defined, all terms (including technical and scientific terms) used herein have the same meaning as commonly understood by one of ordinary skill in the art to which this disclosed subject matter belongs. It will be further understood that terms such as those defined in commonly used dictionaries shall be construed to have meanings consistent with their meanings in the context of the specification and the relevant technology, and shall not be construed in an idealized or overly formal form, unless otherwise expressly defined herein. The terms such as "first" and "second" are only used to distinguish one component (or part of a component) from another component (or part of a component). In this disclosure, the terms "small current" and "large current" are relative terms. A "small current" refers to a current that is much smaller than a "large current". A "large current" refers to a current that is much larger than a "small current".

For ease of description, spatial relative terms such as "upper", "lower", "left", "right", "top", "bottom", etc. may be used herein to describe the spatial positional relationship between a part or element and another part or element as shown in the drawings. For example, the term "on the . . . ", "above . . . ", "on top of . . . ", "on an upper surface of . . . ", "the above," "located on . . . ," or "located on top of . . . ", etc. means that a first element, such as a first structure, exists on a second element, such as a second structure, wherein there may or may not be intervening elements between the first element and the second element. The term "contacting" means connecting a first element, such as a first structure, and a second element, such as a second structure, with or without other elements at the interface of the two elements. The term "adjacent to" means that there are no other elements between the first element and the second element. It will be understood that the spatial relative terms are intended to encompass different orientations of the device in use or operation in addition to the orientation depicted in the drawings. For example, if a part in the drawings is turned upside down, then the part described as "on top of the other part or structure" or "above the other part or structure" would then be oriented as "under the other part or structure" or "below the other part or structure". Thus, the exemplary term "on top of . . . " may include both the orientations "on top of . . . " and "under . . . ". The part may also be oriented in other different ways, rotated 90 degrees or located at other orientations, and the spatial relative descriptions used herein are interpreted accordingly.

As mentioned above, with the development of augmented reality (AR) technology, virtual reality (VR) technology and micro-projection technology, optical machines that are smaller in size and lighter in weight have become the important considerations for the products. A smaller micro-display modules can reduce the size and weight of the optical machine. Usually a micro-display module consists of a light-emitting diode (LED) chip and a driving back plate chip. The size of the LED chip is the size of the display region, which is determined by the specified resolution and pixel pitch. Since other logic circuits need to be arranged around the display region, the overall area of the micro-display module will be larger than the area of the display region. The "area" of the micro-display module refers to the "surface area" of the surface of the micro-display module having the largest area.

FIG. 1 shows a structural schematic diagram of a display module 100. An LED chip 101 is bonded on a driving back plate chip 102. The driving back plate chip 102 is bonded on a printed circuit board (PCB) 103. The LED chip 101 is used to emit light. The size of the LED chip 101 is equal to the size of the display region, which is determined by the specified resolution and pixel pitch. Since logic circuits are usually arranged around the display region, during implementation, the driving back plate chip 102 may include: a pixel drive circuit array, a row scanning circuit, a column scanning circuit, a timing controller, a video processing and algorithm compensation circuit, a power management circuit, a data channel, a data storage unit, an interface circuit, a register configuration circuit, and a sensor circuit, etc. Since there are many circuits that need to be accommodated in the driving back plate chip 102, its area is significantly larger than that of the LED chip 101, which makes it difficult to reduce the overall area of the display module 100.

In addition, the driving back plate chip 102 is usually designed only to support an LED chip 101 of a predetermined size. If the size of the LED chip 101 needs to be changed, the driving back plate chip 102 needs to be redesigned. If any one or more circuits in the driving back plate chip 102 need to be changed, the driving back plate chip 102 also needs to be redesigned. In actual application scenarios, sometimes it is only expected to update and iterate a certain circuit in the driving back plate chip 102. However, because the driving back plate chip 102 needs to be replaced as a whole, tape-out verification needs to be performed again. At present, the cost of tape-out is very expensive, and hence the cost of upgrading the display module is very high.

For the above problems, the present disclosure proposes a display module whose overall area is significantly smaller than the display module shown in FIG. 1 and is easier to perform function iteration. In some embodiments of the present disclosure, the display module may be a micro-display module, such as a Micro-LED micro-display module.

Figure 2:
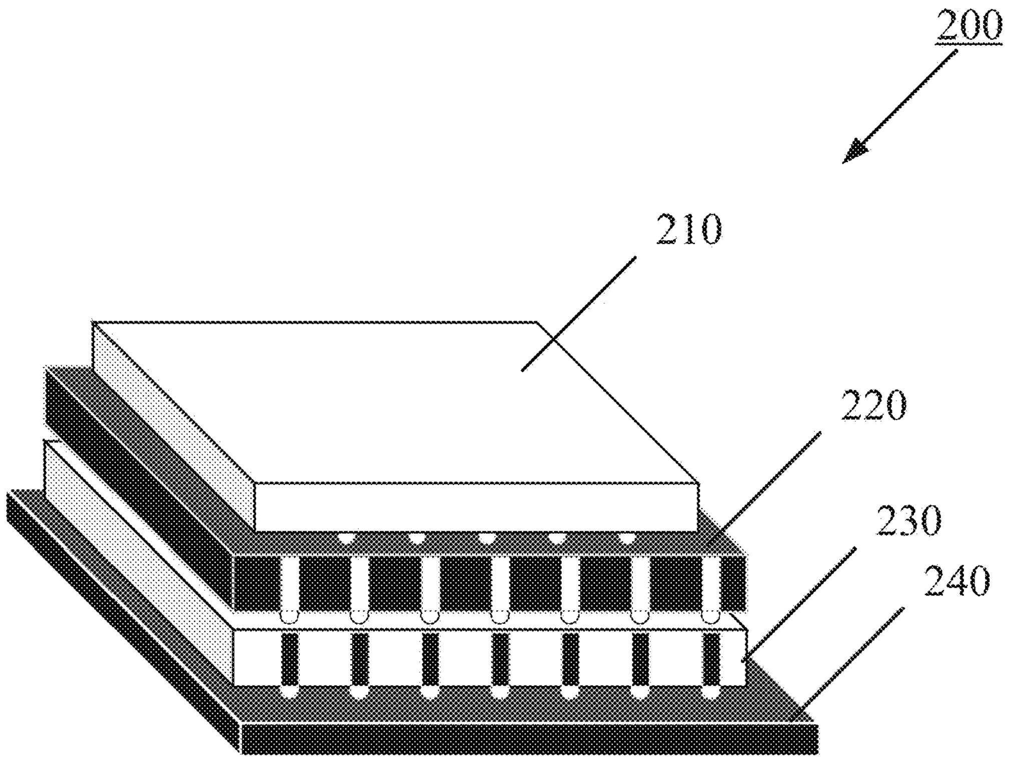
FIG. 2 is an exemplary structural schematic diagram of a display module according to an embodiment of the present disclosure.

FIG. 2 shows an exemplary structural schematic diagram of a display module 200 according to an embodiment of the present disclosure. The display module 200 adopts chip stacking packaging. The display module 200 includes: a substrate 240, a function chip 230 located on the substrate 240, a pixel driver chip 220 located on the function chip 230, and an optical chip 210 located on the pixel driver chip 220. The optical chip 210 may also be called a light-emitting chip and is used to realize light-emitting function of the display module 200. The optical chip 210 may include an LED, an organic light emitting diode (abbreviated as OLED), or a liquid crystal display (abbreviated as LCD), etc. The pixel driver chip 220 is used to realize light emission driving function of the display module 200, and is used to drive the optical chip 210 to emit light. The function chip 230 is used to realize functions of the display module 200 other than light emission driving and light emission. The pixel driver chip 220 and the function chip 230 are chips that are independent of each other, and the pixel driver chip 220 and the function chip 230 are stacked and packaged through chip stacking technology.

Under the circumstances that the number of circuits provided in the display module 200 is the same as the number of circuits provided in the display module 100, compared with the one-dimensional packaging structure of the display module 100 shown in FIG. 1, the three-dimensional packaging structure of the display module 200 shown in FIG. 2 can significantly improve the screen-to-body ratio. Under the circumstances that the area of the optical chip 210 remains unchanged, the area of the driving back plate chip 102 (equivalent to the pixel driver chip 220 plus the function chip 230 in FIG. 2) reduces, and the total area of the display module 200 reduces accordingly. Thus, the area of the optical chip 210 accounts for an increased proportion of the total area of the display module 200. Due to the reduced plan area of the display module 200 according to the embodiments of the present disclosure, the overall thickness has to be increased to accommodate the same number of circuits as the display module 100. However, based on the current substrate thinning technology, the increase in thickness of the display module 200 is very limited. Since the area of the display module 200 is significantly reduced and the increase in thickness is very limited, hence the display module 200 has a very significant weight and size reduction compared to the display module 100. In this way, the display module 200 can be applied to more application scenarios.

In some embodiments of the present disclosure, the pixel driver chip 220 and the optical chip 210 may be homogeneous integrated chips. The pixel driver chip 220 and the optical chip 210 can be built up homogeneously using the same material, thus eliminating the need for a bonding process between the optical chip 210 and the pixel driver chip 220. The material includes but is not limited to Si, GaN, and SiC.

In other embodiments of the present disclosure, the pixel driver chip 220 and the optical chip 210 are chips that are independent of each other. The optical chip 210 is directly bonded on the pixel driver chip 220. In one example, corresponding bonding pads are respectively arranged on the lower surface of the optical chip 210 and the upper surface of the pixel driver chip 220, and the optical chip 210 and the pixel driver chip 220 are bonded through the corresponding bonding pads. In some embodiments of the present disclosure, the pixel driver chip 220 may be bonded to a non-homogeneous optical chip 210 first, and then stacked and packaged with the function chip 230.

In some embodiments of the present disclosure, the orthographic projection of the optical chip 210 on the substrate 240 is included in the orthographic projection of the pixel driver chip 220 on the substrate 240. The orthographic projection of the function chip 230 on the substrate 240 and the orthographic projection of the pixel driver chip 220 on the substrate 240 are completely overlapped. In this way, the area of the display module 200 is based on the area of the pixel driver chip 220, and the area of the pixel driver chip 220 is the area of the display module 200.

In some embodiments of the present disclosure, the pixel driver chip 220 may be designed to be compatible with the optical chip 210 of any size smaller than its area. Alternatively, since the pixel driver chip 220 and the function chip 230 are chips that are independent of each other, even if the pixel driver chip 220 can only adapt to one size of the optical chip 210, when the size of the optical chip 210 needs to be changed, only the optical chip 210 and the pixel driver chip 220 in the display module 200 can be replaced without replacing the function chip 230.

Figure 3:
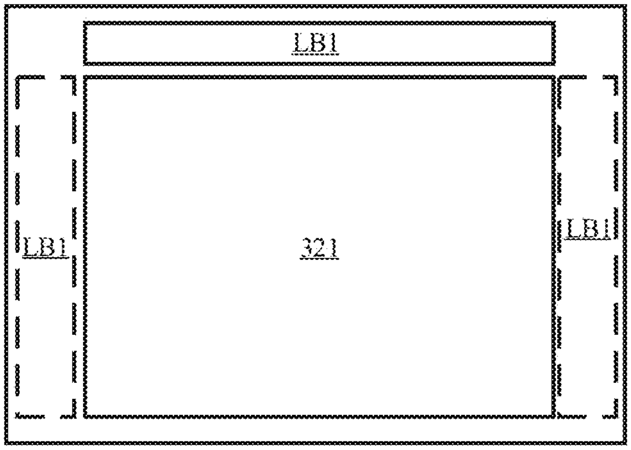
FIG. 3 is an exemplary structural schematic diagram of a pixel driver chip in the display module according to an embodiment of the present disclosure.
Figure 4:
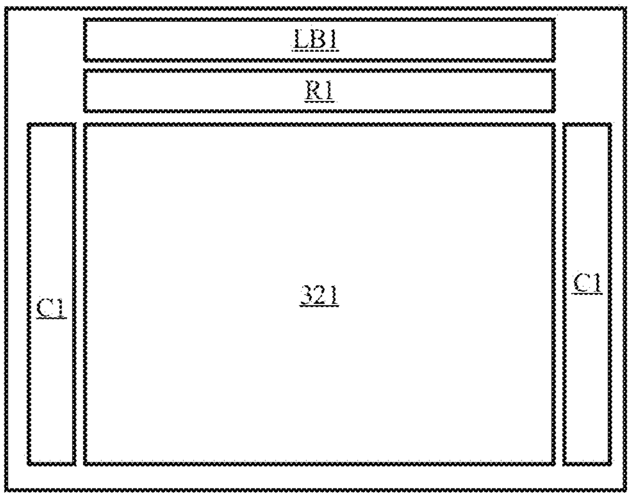
FIG. 4 is another exemplary structural schematic diagram of the pixel driver chip in the display module according to an embodiment of the present disclosure.

With reference to FIG. 3 and FIG. 4, the following describes two plan arrangements that can be adopted by the pixel driver chip 220.

FIG. 3 shows an exemplary plan structure schematic diagram of the pixel driver chip 220 in the display module 200 according to an embodiment of the present disclosure. The pixel driver chip 220 may include: a pixel drive circuit array 321 and at least one first lower level bonding region LB1. In the example of FIG. 3, three first lower level bonding regions LB1 are shown (the boxes in dashed lines indicate that those first lower level bonding regions LB1 are optional). The first lower level bonding regions LB1 are arranged around the pixel drive circuit array 321 (at the edge position of the pixel driver chip 220). The line delay of the pixel drive circuit array 321 can be reduced by providing the first lower level bonding regions LB1 on three sides of the pixel drive circuit array 321. Without considering the line delay, only one first lower level bonding region LB1 (for example, the first lower level bonding region LB1 shown by the box in solid line) can be provided, and the communication lines of the pixel drive circuit array 321 and the lower level function chip 230 can be routed to the first lower level bonding region LB1 through pre-routing.

In some embodiments of the present disclosure, the orthographic projection of the pixel drive circuit array 321 on the substrate 240 and the orthographic projection of the optical chip 210 on the substrate 240 are completely overlapped. The orthographic projection of the first lower level bonding regions LB1 of the pixel driver chip 220 on the substrate 240 do not overlap with the orthographic projection of the optical chip 210 on the substrate 240. In this way, the electrical signals transmitted in the first lower level bonding regions LB1 will not interfere with the display region in the optical chip 210.

In some embodiments of the present disclosure, the function chip 230 includes at least one first upper level bonding region. The orthographic projection of the first lower level bonding regions LB1 of the pixel driver chip 220 on the substrate 240 and the orthographic projection of the first upper level bonding regions of the function chip 230 on the substrate 240 are at least partially overlapped. The first lower level bonding regions LB1 are connected to the first upper level bonding regions correspondingly. In other words, each first lower level bonding region LB1 is connected to its nearest first upper level bonding region (which may also be referred to as the "corresponding first upper level bonding region"). The pixel driver chip 220 is connected to the function chip 230 via the first lower level bonding regions LB1 and the first upper level bonding regions, so that the pixel driver chip 220 and the function chip 230 can communicate with each other. Since each first lower level bonding region LB1 is connected to a corresponding first upper level bonding region, line delay in communication between the pixel driver chip 220 and the function chip 230 can be reduced.

In one example, at least one bonding pad is provided in the first upper level bonding region of the function chip 230.

The first lower level bonding region LB1 of the pixel driver chip 220 is bonded to the at least one bonding pad in the first upper level bonding region of the function chip 230 through a through-silicon via (TSV). The material of the at least one bonding pad is, for example, Al, TiN, Au, Cu or an alloy containing at least one of the above, etc. In applications requiring vertical vias with high bandwidth and low latency, larger vias can be used to achieve larger bonding contact areas, thereby ensuring lower resistance and better electrical transmission.

In another example, the first lower level bonding region LB1 of the pixel driver chip 220 and the first upper level bonding region of the function chip 230 are connected through a direct interconnection structure. The direct interconnection structure is the shortest interconnection structure (i.e., an interconnection path having the shortest distance) connecting the first lower level bonding region LB1 of the pixel driver chip 220 and the first upper level bonding region of the function chip 230. For example, a plurality of first micro-contacts is arranged in the first lower level bonding region LB1 of the pixel driver chip 220, and a plurality of second micro-contacts is arranged in the first upper level bonding region of the function chip 230. The first micro-contacts and the corresponding second micro-contacts are connected by soldering.

For the pixel driver chip 220 shown in FIG. 3, the function chip 230 adapted thereto may include a row scanning circuit, a column scanning circuit, and one or more of the following: a time schedule controller, a video processing and algorithm compensation circuit, a power management circuit, a data channel, a data storage unit, an interface circuit, a register configuration circuit, and a sensor circuit. Those skilled in the art should understand that the function chip 230 may also include other function modules required by the display module 200, and this disclosure will not be exhaustive here. Among them, the row scanning circuit and the column scanning circuit are used to provide row scanning signals and column scanning signals to the pixel drive circuit array 321 respectively.

Since the row scanning circuit and the column scanning circuit need to communicate with the pixel drive circuit array 321 through a large number of through-silicon vias, the requirement for the processing of the through-silicon vias is relatively high. If reduction of the number of through-silicon vias in the pixel driver chip 220 is desired, the packaging solution of FIG. 4 can be selected, and the row scanning circuit and the column scanning circuit are arranged in the pixel driver chip 220. However, this will increase the area of the pixel driver chip 220, thereby increasing the overall packaging area of the display module 200 and reducing the screen-to-body ratio. Those skilled in the art can make a balanced choice based on the advantages and disadvantages of the exemplary structures of FIGS. 3 and 4.

As shown in FIG. 4, based on the example of FIG. 3, the pixel driver chip 220 further includes: a row scanning circuit R1 and column scanning circuits C1. The row scanning circuit R1, for example, is arranged above the pixel drive circuit array 321 in a row direction. The column scanning circuits C1, for example, are arranged on the left and right sides of the pixel drive circuit array 321 in a column direction. Those skilled in the art will understand that the row direction and the column direction herein may be interchanged. The orthographic projection of the pixel drive circuit array 321 on the substrate 240 and the orthographic projection of the optical chip 210 on the substrate 240 are completely overlapped. The orthographic projections of the first lower level bonding region LB1, the row scanning circuit R1, and the column scanning circuits C1 of the pixel driver chip 220 on the substrate 240 and the orthographic projection of the optical chip 210 on the substrate 240 are not overlapped. In the example of FIG. 4, since both the row scanning circuit R1 and the column scanning circuits C1 are arranged in the pixel driver chip 220, the TSVs required for the pixel drive circuit array 321 to communicate with the function chip 230 are significantly reduced, so that the number of the first lower level bonding region LB1 can be one.

The method of connection between the first lower level bonding region LB1 of the pixel driver chip 220 and the first upper level bonding region of the function chip 230 in FIG. 4 is the same as the example in FIG. 3 and will not be described again here.

For the pixel driver chip 220 shown in FIG. 4, the function chip 230 adapted thereto may include one or more of the following: a time schedule controller, a video processing and algorithm compensation circuit, a power management circuit, a data channel, a data storage unit, an interface circuit, a register configuration circuit, and a sensor circuit. Those skilled in the art should understand that the function chip 230 may also include other function modules required by the display module 200, and the present disclosure will not be exhaustive here.

In some embodiments of the present disclosure, under the circumstances that it is difficult for the function chip 230 to maintain the same area as the pixel driver chip 220 due to the inclusion of numerous circuits, or due to considerations such as heat dissipation, line delay, voltage drop, etc., the function chip 230 can be divided into two sub-function chips. These two sub-function chips are arranged into upper and lower layers. In this context, the sub-function chip located at the upper layer is called the first sub-function chip, and the sub-function chip located at the lower layer is called the second sub-function chip. The first sub-function chip and the second sub-function chip are chips that are independent of each other, and the first sub-function chip and the second sub-function chip are stacked and packaged through chip stacking technology.

Figure 5:
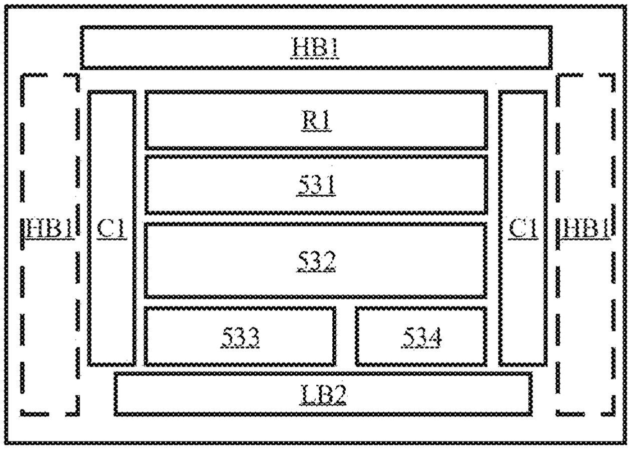
FIG. 5 is an exemplary structural schematic diagram of a first sub-function chip in the display module according to an embodiment of the present disclosure.
Figure 6:
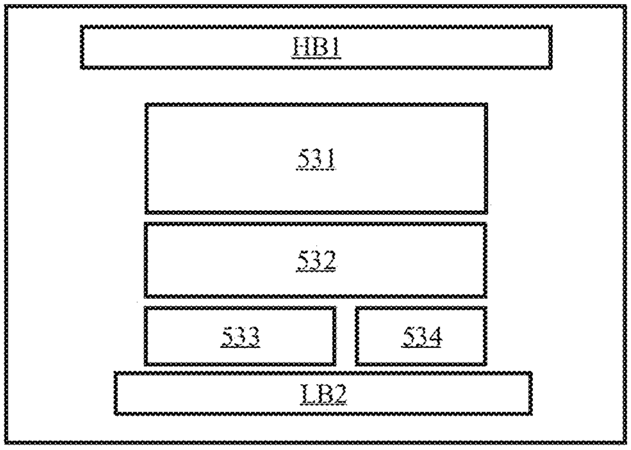
FIG. 6 is another exemplary structural schematic diagram of the first sub-function chip in the display module according to an embodiment of the present disclosure.

The following describes two possible plan arrangements for the first sub-function chip with reference to FIGS. 5 and 6. Among them, the first sub-function chip shown in FIG. 5 is adapted to the pixel driver chip 220 shown in FIG. 3. The first sub-function chip shown in FIG. 6 is adapted to the pixel driver chip 220 shown in FIG. 4.

FIG. 5 shows an exemplary plan structure schematic diagram of the first sub-function chip in the display module 200 according to an embodiment of the present disclosure. In the example of FIG. 5, the first sub-function chip includes a row scanning circuit R1, column scanning circuits C1, a time schedule controller 531, a video processing and algorithm compensation circuit 532, a first power management circuit 533, a data channel 534, at least one first upper level bonding region HB1, and at least one second lower level bonding region LB2. The first sub-function chip may also include other function modules. In this example, considering the factors such as shorter routing distance of the display region, sequence of data transmission, display delay of the screen and voltage drop, the row scanning circuit R1, the column scanning circuits C1, the time schedule controller 531, the video processing and algorithm compensation circuit 532, the first power management circuit 533, and the data channel 534 are arranged in the first sub-function chip rather than the second sub-function chip.

In the example of FIG. 5, three first upper level bonding regions HB1 are shown (the boxes in dashed lines indicate that those first upper level bonding regions HB1 are optional). In some embodiments of the present disclosure, the first upper level bonding regions HB1 are arranged at the edge position of the first sub-function chip. By arranging the first upper level bonding regions HB1 on three sides of the first sub-function chip, and arranging the row scanning circuit R1 and the column scanning circuits C1 adjacent to the first upper level bonding regions HB1, the routing distance between the row scanning circuit R1 and the column scanning circuits C1 and the upper level pixel drive circuit array 321 can be reduced, and the voltage can be dropped. In addition, it should be noted that the number and position of the first upper level bonding regions HB1 should match the number and position of the first lower level bonding regions LB1 of the pixel driver chip 220.

In some embodiments of the present disclosure, since the time schedule control signals generated by the time schedule controller 531 needs to be directly provided to the row scanning circuit R1 and the column scanning circuits C1 for generating row scanning signals and column scanning signals respectively, the time schedule controller 531 is arranged adjacent to the row scanning circuit R1 and the column scanning circuits C1 in order to shorten the routing distance between them.

In some embodiments of the present disclosure, the video processing and algorithm compensation circuit 532 is arranged adjacent to the column scanning circuits C1 and the data channel 534 to facilitate the video processing and algorithm compensation circuit 532 to receive data from the data channel 534 and to facilitate the output of data generated by the video processing and algorithm compensation circuit 532 to a column scanning module. In addition, other function modules required by the display module 200 may also be arranged at the location of the video processing and algorithm compensation circuit 532.

In some embodiments of the present disclosure, in the case where the second sub-function chip includes a data storage unit and/or an interface circuit, the data channel 534 is arranged adjacent to the second lower level bonding region LB2 in order to provide data to the data storage unit and/or the interface circuit with the shortest line distance, and minimize signal delay problems caused by line parasitics.

In some embodiments of the present disclosure, the purpose of arranging the first power management circuit 533 in the first sub-function chip is to facilitate power supply to circuits and display regions in the first sub-function chip that requires only a current that is much smaller than a large current. Especially during constant current driving and/or constant voltage driving, since the path from the first power management circuit 533 to the above-mentioned circuits and the display region is shorter, the voltage on this path can be dropped even lower, thus ensuring uniform supply of power to the display region.

FIG. 6 shows another exemplary plan structure schematic diagram of the first sub-function chip in the display module 200 according to an embodiment of the present disclosure. As mentioned above, the first sub-function chip shown in FIG. 6 is adapted to the pixel driver chip 220 shown in FIG. 4. Since the pixel driver chip 220 shown in FIG. 4 is provided with the row scanning circuit R1 and the column scanning circuits C1, the first sub-function chip shown in FIG. 6 does not need to be provided with the row scanning circuit R1 and the column scanning circuits C1. Correspondingly, the first sub-function chip only needs to be provided with a first upper level bonding region HB1. It should be noted that the position of the first upper level bonding region HB1 should match the position of the first lower level bonding region LB1 of the pixel driver chip 220. In addition, other circuits in the first sub-function chip shown in FIG. 6 (for example, the time schedule controller 531, the video processing and algorithm compensation circuit 532, the first power management circuit 533, and the data channel 534) may be arranged in the same manner as the first sub-function chip shown in FIG. 5.

In some embodiments of the present disclosure, the time schedule controller 531 in the first sub-function chip is arranged adjacent to the first upper level bonding region HB1 in order to provides time schedule control signals to the row scanning circuit R1 and the column scanning circuits C1 of the pixel driver chip 220 with the shortest line distance.

Figure 7:
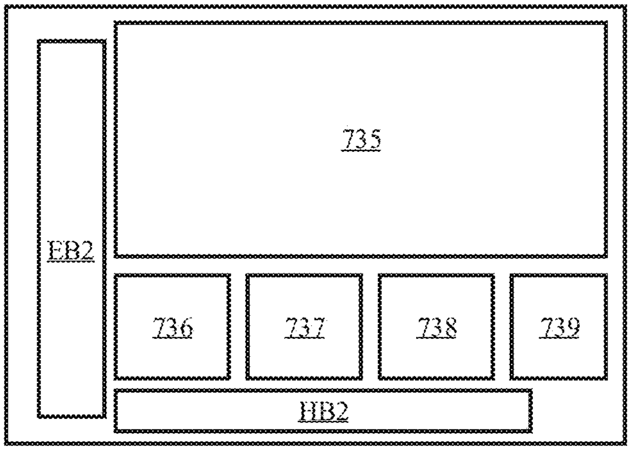
FIG. 7 is an exemplary structural schematic diagram of a second sub-function chip in the display module according to an embodiment of the present disclosure.

FIG. 7 shows an exemplary plan structure schematic diagram of the second sub-function chip in the display module 200 according to an embodiment of the present disclosure. In the example of FIG. 7, the second sub-function chip includes: a data storage unit 735, an interface circuit 736, a second power management circuit 737, a register configuration circuit 738, a sensor circuit 739, at least one second upper level bonding region HB2, and a second external bonding region EB2.

In some embodiments of the present disclosure, the orthographic projection of the second lower level bonding region LB2 of the first sub-function chip on the substrate 240 and the orthographic projection of the second upper level bonding region HB2 of the second sub-function chip on the substrate 240 are at least partially overlapped. The second lower level bonding region LB2 of the first sub-function chip is connected to the second upper level bonding region HB2 of the second sub-function chip correspondingly, so that the first sub-function chip and the second sub-function chip are in communication with each other.

In some embodiments of the present disclosure, the interface circuit 736 needs to be physically connected to the communication connection medium EXM outside the display module 200. In consideration of the actual physical distance, the interface circuit 736 is arranged adjacent to the second external bonding region EB2.

Since the data storage unit 735 needs to communicate with the interface circuit 736 and the data channel 534 of the first sub-function chip, it may need to perform a frame storage function. Considering that the area of the data storage unit 735 itself is larger when a high line width process is applied, it is more appropriate to arrange it in the second sub-function chip which has a larger space.

The power management circuit generates more heat in a large current scenario. Arranging the second power management circuit 737 close to a bottom layer (substrate 240) for handling large current can facilitate quick heat conduction and heat dissipation. In some embodiments of the present disclosure, the first power management circuit 533 may not be arranged in the first sub-function chip. If the first power management circuit 533 is not arranged in the first sub-function chip, the power of the entire display module 200 is provided by the second power management circuit 737, then attention should be paid to expanding the number of TSV vias to ensure that large current is uniformly transmitted to the pixel driver chip 220 and the optical chip 210 that require more current.

Since the register configuration circuit 738 needs to interconnect and communicate with the interface circuit 736, it is arranged in the same chip as the interface circuit 736.

The sensor circuit 739 includes functions such as temperature detection, and is used to detect and feed back the detected data to the register configuration circuit 738 in real time. Considering the connection distance between the sensor circuit 739 and the register configuration circuit 738 as well as the sensitivity and accuracy of temperature detection, the sensor circuit 739 is also arranged in the second sub-function chip close to the substrate 240.

Figure 8:
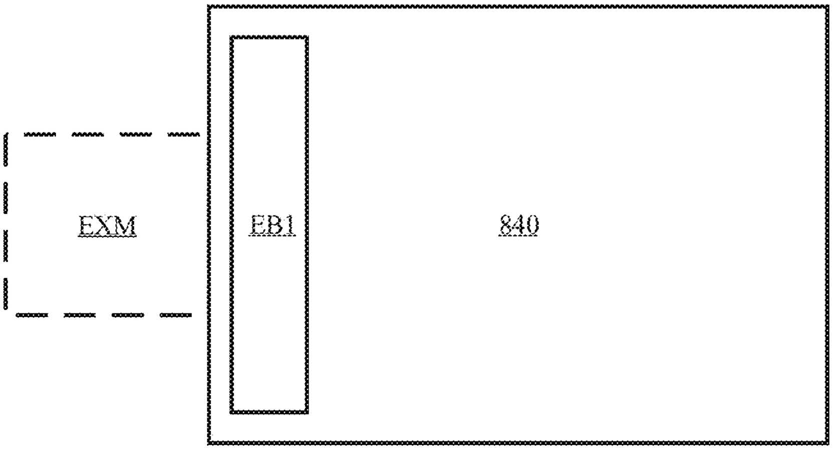
FIG. 8 is an exemplary schematic structural diagram of a substrate in the display module according to an embodiment of the present disclosure.

FIG. 8 shows an exemplary plan structure schematic view of the substrate 840 in the display module 200 according to an embodiment of the present disclosure. The substrate 840 may also be called an interposer, which includes but is not limited to: a PCB, a backing (e.g., glass backing, silicon backing), a heat dissipation medium, etc.

In the example of FIG. 8, the substrate 840 includes a first external bonding region EB1. The first external bonding region EB1 is used to connect to an external communication connection medium EXM. The orthographic projection of the first external bonding region EB1 of the substrate 840 on the substrate 840 and the orthographic projection of the second external bonding region EB2 of the second sub-function chip on the substrate 840 are at least partially overlapped, so as to connect the external communication connection medium EXM with the interface circuit 736 of the second sub-function chip.

Furthermore, when considering subsequent iteration of the display module, various chips in the display module 200 can be replaced with different processes. For example, for the second sub-function chip, one can consider implementing an interface rate of a higher speed and a data storage unit 735 having a smaller area, and can also replace by a technology with fewer processes, in order to increase the interface speed, reduce the area of the module, reduce power consumption, and at the same time optimize the heat conduction issue of the display module 200.

Since the conductive media of the anodes and cathodes in the optical chip 210 need to be processed in a targeted manner, a semiconductor process or material different from that of other chips needs to be selected. In addition, various chips in the display module 200 can be replaced individually, and it is only necessary to ensure that the design of the bonding region position of the subsequent iteration chips remains unchanged.

Figure 9:
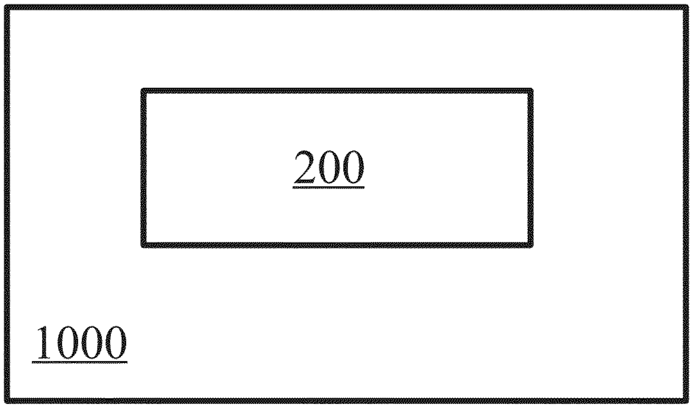
FIG. 9 is a schematic block diagram of a display device according to an embodiment of the present disclosure.

FIG. 9 shows a schematic block diagram of a display device 1000 according to an embodiment of the present disclosure. The display device 1000 may include a display module 200 as shown in FIG. 2. The display device 1000 provided in the embodiment of the present disclosure can be applied to any product with display function, such as optical machine, E-paper, mobile phone, tablet computer, television, notebook computer, digital photo frame, wearable device or navigator, etc.

To sum up, the display module according to the embodiments of the present disclosure can be split for functional iteration, thereby saving high tape-out costs and improving the speed of launching of the products. Compared with the one-dimensional packaging structure, the display module according to the embodiments of the present disclosure has reduced the overall size and greatly increased the screen-to-body ratio. Although its thickness has increased to a certain extent, it has a very obvious weight and size reduction compared with the one-dimensional packaging structure, and it can be applied to more application scenarios. The display device according to the embodiments of the present disclosure also has the above-mentioned advantages.

As used herein and in the appended claims, the singular form of a word includes the plural form and vice versa, unless the context clearly dictates otherwise. Thus, a reference to the singular will usually include the plural of a corresponding term. Similarly, the wordings "include" and "comprise" will be interpreted to mean inclusively and not exclusively. Likewise, the terms "include" and "or" should be construed as inclusive unless such construction is expressly prohibited by the context. Where the term "example" is used herein, particularly when it follows a group of terms, the "example" is only exemplary and illustrative, and should not be considered exclusive or comprehensive.

Further aspects and scope of adaptability become apparent from the description provided herein. It should be understood that various aspects of the present application may be implemented alone or in combination with one or more other aspects. It should also be understood that the description and specific examples herein are intended for purposes of illustration only and are not intended to limit the scope of the application.

Several embodiments of the present disclosure have been described in detail above, but it is obvious that those skilled in the art can make various modifications and variations to the embodiments of the present disclosure without departing from the spirit and scope of the present disclosure. The scope of the present disclosure is defined by the appended claims.

The invention claimed is:

1. A micro-display module, comprising:

a substrate;

a function chip located on the substrate, the function chip being used to realize functions of the micro-display module other than light emission driving and light emission;

a pixel driver chip located on the function chip; and an optical chip located on the pixel driver chip;

wherein the pixel driver chip and the function chip are chips that are independent of each other, and the pixel driver chip and the function chip are stacked and packaged through chip stacking technology;

wherein the pixel driver chip comprises: a pixel drive circuit array and at least one first lower level bonding region, the function chip comprises at least one first upper level bonding region, an orthographic projection of the at least one first lower level bonding region on the substrate and an orthographic projection of the at least one first upper level bonding region on the substrate are at least partially overlapped, and the first lower level bonding region and the first upper level bonding region are connected correspondingly so that the pixel driver chip and the function chip are in communication with each other;

wherein the function chip comprises a row scanning circuit, a column scanning circuit, and at least one of the following: a timing controller, a video processing and algorithm compensation circuit, a power management circuit, a data channel, a data storage unit, an interface circuit, a register configuration circuit, and a sensor circuit;

wherein the function chip comprises a first sub-function chip and a second sub-function chip, the first sub-function chip is located on the second sub-function chip, the first sub-function chip and the second sub-function chip are chips that are independent of each other, and the first sub-function chip and the second sub-function chip are stacked and packaged through chip stacking technology;

the first sub-function chip comprises the row scanning circuit, the column scanning circuit, and at least one of the following: the timing controller, the video processing and algorithm compensation circuit, a first power management circuit, and the data channel;

the second sub-function chip comprises at least one of the following: the data storage unit, the interface circuit, a second power management circuit, the register configuration circuit, and the sensor circuit.

2. The micro-display module according to claim 1, wherein the pixel driver chip and the optical chip are homogeneous integrated chips.

3. The micro-display module according to claim 1, wherein the pixel driver chip and the optical chip are chips that are independent of each other, and the optical chip is bonded on the pixel driver chip.

4. The micro-display module according to claim 1, wherein an orthographic projection of the optical chip on the substrate is included in an orthographic projection of the pixel driver chip on the substrate.

5. The micro-display module according to claim 1, wherein an orthographic projection of the function chip on the substrate and an orthographic projection of the pixel driver chip on the substrate are completely overlapped.

6. The micro-display module according to claim 1, wherein an orthographic projection of the pixel drive circuit array on the substrate and the orthographic projection of the optical chip on the substrate are completely overlapped, and the orthographic projection of the at least one first lower level bonding region on the substrate and the orthographic projection of the optical chip on the substrate are not overlapped.

7. The micro-display module according to claim 1, wherein the at least one first upper level bonding region is provided with at least one bonding pad, and the first lower level bonding region is bonded to the at least one bonding pad in the first upper level bonding region through a through-silicon via.

8. The micro-display module according to claim 1, wherein the first lower level bonding region is connected with the first upper level bonding region through a direct interconnection structure, the direct interconnection structure being a shortest interconnection structure that connects the first lower level bonding region and the first upper level bonding region.

9. The micro-display module according to claim 1, wherein the first sub-function chip further comprises: at least one second lower level bonding region, the second sub-function chip further comprises: at least one second upper level bonding region, an orthographic projection of the at least one second lower level bonding region on the substrate and an orthographic projection of the at least one second upper level bonding region on the substrate are at least partially overlapped, and the second lower level bonding region and the second upper level bonding region are connected correspondingly so that the first sub-function chip and the second sub-function chip are in communication with each other.

10. The micro-display module according to claim 9, wherein the first sub-function chip comprises the data channel, the data channel being arranged adjacent to the at least one second lower level bonding region.

11. The micro-display module according to claim 1, wherein the first sub-function chip further comprises: the at least one first upper level bonding region, and the row scanning circuit and the column scanning circuit are arranged adjacent to the at least one first upper level bonding region.

12. The micro-display module according to claim 1, wherein the first sub-function chip comprises at least one of the following:

the timing controller, the timing controller being arranged adjacent to the row scanning circuit and the column scanning circuit; and the video processing and algorithm compensation circuit and the data channel, the video processing and algorithm compensation circuit being arranged adjacent to the column scanning circuit and the data channel.

13. The micro-display module according to claim 1, wherein the substrate comprises a first external bonding region, the first external bonding region being used to connect with an external communication connection medium;

the second sub-function chip further comprises: a second external bonding region and the interface circuit, an orthographic projection of the first external bonding region on the substrate and an orthographic projection of the second external bonding region on the substrate are at least partially overlapped, and the interface circuit is arranged adjacent to the second external bonding region.

14. The micro-display module according to claim 1, wherein the first sub-function chip comprises the first power management circuit, the first power management circuit being configured to provide a first current, and the second sub-function chip comprises the second power management circuit, the second power management circuit being configured to provide a second current that is greater than the first current.

15. The micro-display module according to claim 1, wherein the pixel driver chip further comprises: a row scanning circuit and a column scanning circuit, the orthographic projection of the pixel drive circuit array on the substrate and the orthographic projection of the optical chip on the substrate are completely overlapped, the orthographic projections of the at least one first lower level bonding region, the row scanning circuit and the column scanning circuit on the substrate and the orthographic projection of the optical chip on the substrate are not overlapped.

16. The micro-display module according to claim 15, wherein at least one bonding pad is provided in the at least one first upper level bonding region, and the first lower level bonding region is bonded to the at least one bonding pad in the first upper level bonding region through a through-silicon via.

17. The micro-display module according to claim 15, wherein the first lower level bonding region is connected with the first upper level bonding region through a direct interconnection structure, the direct interconnection structure being a shortest interconnection structure that connects the first lower level bonding region and the first upper level bonding region.

18. The micro-display module according to claim 15, wherein the function chip comprises at least one of the following: a timing controller, a video processing and algorithm compensation circuit, a power management circuit, a data channel, a data storage unit, an interface circuit, a register configuration circuit, and a sensor circuit.

19. The micro-display module according to claim 18, wherein the function chip comprises a first sub-function chip and a second sub-function chip, the first sub-function chip is located on the second sub-function chip, the first sub-function chip and the second sub-function chip are chips that are independent of each other, and the first sub-function chip and the second sub-function chip are stacked and packaged through chip stacking technology;

the first sub-function chip comprises at least one of the following: the timing controller, the video processing and algorithm compensation circuit, a first power management circuit, and the data channel;

the second sub-function chip comprises at least one of the following: the data storage unit, the interface circuit, a second power management circuit, the register configuration circuit, and the sensor circuit.

20. The micro-display module according to claim 19, wherein the first sub-function chip further comprises: at least one second lower level bonding region, the second sub-function chip further comprises: at least one second upper level bonding region, an orthographic projection of the at least one second lower level bonding region on the substrate and an orthographic projection of the at least one second upper level bonding region on the substrate are at least partially overlapped, and the second lower level bonding region and the second upper level bonding region are connected correspondingly so that the first sub-function chip and the second sub-function chip are in communication with each other; wherein the first sub-function chip comprises the data channel, the data channel being arranged adjacent to the at least one second lower level bonding region.

21. The micro-display module according to claim 19, wherein the first sub-function chip further comprises: the at least one first upper level bonding region and the timing controller, the timing controller being arranged adjacent to the at least one first upper level bonding region.

22. The micro-display module according to claim 19, wherein the first sub-function chip comprises at least one of the following:

the video processing and algorithm compensation circuit and the data channel, the video processing and algorithm compensation circuit being arranged adjacent to the data channel; and the first power management circuit, the first power management circuit being configured to provide a first current, and the second sub-function chip comprises the second power management circuit, the second power management circuit being configured to provide a second current that is greater than the first current.

23. The micro-display module according to claim 19, wherein the substrate comprises a first external bonding region, and the first external bonding region being used to connect with an external communication connection medium;

the second sub-function chip further comprises: a second external bonding region and the interface circuit, an orthographic projection of the first external bonding region on the substrate and an orthographic projection of the second external bonding region on the substrate are at least partially overlapped, and the interface circuit is arranged adjacent to the second external bonding region.

24. A display device, comprising: a micro-display module, wherein the micro-display module comprises:

a substrate;

a function chip located on the substrate, the function chip being used to realize functions of the micro-display module other than light emission driving and light emission;

a pixel driver chip located on the function chip; and an optical chip located on the pixel driver chip;

wherein the pixel driver chip and the function chip are chips that are independent of each other, and the pixel driver chip and the function chip are stacked and packaged through chip stacking technology;

wherein the pixel driver chip comprises: a pixel drive circuit array and at least one first lower level bonding region, the function chip comprises at least one first upper level bonding region, an orthographic projection of the at least one first lower level bonding region on the substrate and an orthographic projection of the at least one first upper level bonding region on the substrate are at least partially overlapped, and the first lower level bonding region and the first upper level bonding region are connected correspondingly so that the pixel driver chip and the function chip are in communication with each other;

wherein the function chip comprises a row scanning circuit, a column scanning circuit, and at least one of the following: a timing controller, a video processing and algorithm compensation circuit, a power management circuit, a data channel, a data storage unit, an interface circuit, a register configuration circuit, and a sensor circuit;

wherein the function chip comprises a first sub-function chip and a second sub-function chip, the first sub-function chip is located on the second sub-function chip, the first sub-function chip and the second sub-function chip are chips that are independent of each other, and the first sub-function chip and the second sub-function chip are stacked and packaged through chip stacking technology;

the first sub-function chip comprises the row scanning circuit, the column scanning circuit, and at least one of the following: the timing controller, the video processing and algorithm compensation circuit, a first power management circuit, and the data channel;

the second sub-function chip comprises at least one of the following: the data storage unit, the interface circuit, a second power management circuit, the register configuration circuit, and the sensor circuit.

* * * * *